(12) United States Patent
Wile

(10) Patent No.: US 6,362,679 B2
(45) Date of Patent: Mar. 26, 2002

(54) POWER DEVICE DRIVER CIRCUIT

(75) Inventor: Donald T. Wile, San Jose, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/765,833

(22) Filed: Jan. 19, 2001

Related U.S. Application Data

(60) Provisional application No. 60/184,214, filed on Feb. 23, 2000.

(51) Int. Cl.[7] ................................................ H03K 17/30
(52) U.S. Cl. ....................................... 327/382; 327/333
(58) Field of Search ................................ 327/111, 112, 327/108, 382, 427, 333; 363/56.02; 323/283, 288

(56) References Cited

U.S. PATENT DOCUMENTS

| | | | |
|---|---|---|---|
| 4,994,955 A | 2/1991 | Schoofs et al. ................ 363/95 |
| 5,552,731 A | * 9/1996 | Diazzi et al. ................ 327/109 |
| 5,742,196 A | * 4/1998 | Fronen et al. ............... 327/382 |

* cited by examiner

*Primary Examiner*—Shawn Riley
(74) *Attorney, Agent, or Firm*—Beyer Weaver & Thomas, LLP

(57) ABSTRACT

Circuits and techniques are described for compensating for a first parasitic current corresponding to a first parasitic capacitance associated with a first switch. A second switch is configured substantially the same as the first switch, the second switch having a second parasitic capacitance associated therewith. A current mirror coupled to the second switch generates a compensating current in response to a second parasitic current corresponding to the second parasitic capacitance. The compensating current compensates for at least a portion of the first parasitic current.

8 Claims, 3 Drawing Sheets

POWER DEVICE DRIVER CIRCUIT

RELATED APPLICATION DATA

The present application claims priority from U.S. Provisional Application No. 60/184,214 for IMPROVED POWER FET DRIVER CIRCUIT filed on Feb. 23, 2000, the entirety of which is incorporated herein by reference for all purposes.

BACKGROUND OF THE INVENTION

The present invention relates to techniques for driving devices in half-bridge configurations. More specifically, the present invention provides techniques and circuitry for driving a high side device in a half-bridge configuration into an inductive load in a manner which reduces the effects of parasitic capacitances.

FIG. 1 is a schematic of a driver circuit 100 for the high side device in a half bridge circuit as described in U.S. Pat. No. 4,994,955 for HALF-BRIDGE DRIVER WHICH IS INSENSITIVE TO COMMON MODE CURRENTS issued on Feb. 19, 1991, the entirety of which is incorporated herein by reference for all purposes. The lower half of the schematic is the transmitter portion 76 of a level shifter which converts pulsatile inputs at $V_{ON}$ and $V_{OFF}$ into current pulses $I_{ON}$ and $I_{OFF}$, respectively. The upper half of the schematic is the receiver portion 78 of a high side driver which generates the gate to source voltage for the high side device (not shown) between lines 38 and 40. Current pulse $I_{ON}$ is transmitted alone to place the high side device in a conductive state, while current pulse $I_{OFF}$ is transmitted alone to place the high side device in a non-conductive state.

To provide insensitivity to common mode currents $I_C$ (due to parasitic capacitances 82), a double differential amplifier comprising transistors $T_1$ and $T_2$ and matched resistors $R_5$ and $R_6$ is employed. The double differential amplifier produces substantially identical voltages at $V_1$ and $V_2$ in response to the common mode currents which will not turn on transistors $T_1$ and $T_2$. By contrast, the current pulse $I_{ON}$ flowing only in line 70 turns on $T_1$ while the current pulse $I_{OFF}$ flowing only in line 72 turns on $T_2$. The resulting set and reset voltages ($V_s$ and $V_R$) are input to an RS flip-flop 96 which provides the gate drive to the high side device via buffer 106.

Unfortunately, the solution provided by the circuit of FIG. 1 does not address other undesirable effects of parasitic capacitance 82. For example, if the high side device being driven by the circuit of FIG. 1 drives an inductive load or filter, the resonant current in the inductor can drive the device output toward its positive rail. This positive going output voltage swing, in turn, causes current to flow in parasitic capacitances 82 (these capacitances being charged via either $R_1$, $R_2$, $T_9$, and $T_{12}$). As this current flows, the $V_D$ supply rail moves up in voltage. That is, $V_D$ moves up as the output of the high side device approaches its rail because the high side device output is coupled to the $V_D$ rail via a "bootstrap" capacitance.

As voltages are developed across $R_1$ and $R_2$ due to the parasitic currents, the "on" and "off" signals into the high side driver are simultaneously activated. The magnitude of these currents can be such as to active the clamping mechanism implemented with transistors $T_{11}$ and $T_{12}$. During the time when $T_{11}$ and $T_{12}$ are activated, input pulses are ignored. As a result, legitimate "on" pulses could be ignored because of the parasitic currents. This is clearly an undesirable result.

A potential solution to this problem could be to reduce the values of resistors $R_1$ and $R_2$ in an attempt to reduce the likelihood of this clamping effect. However, this would require more current to operate the circuit and does not guarantee that the problem is eliminated for all values of output inductors, output transistors, and control signal pulse widths. It should also be noted that eliminating the pulse generators driving $V_{ON}$ and $V_{OFF}$ alone does not solve the problem as the "on" signal may still be shorter in duration than the duration of the clamping.

It is therefore desirable to provide techniques by which it can be ensured that an "on" signal for the high side device in a half-bridge configuration is never unintentionally ignored.

SUMMARY OF THE INVENTION

According to the present invention, techniques and circuitry are provided which compensate for the effects of parasitic currents in half-bridge driver circuits such that "on" signals are not unintentionally ignored. In addition, and according to specific embodiments, the techniques of the present invention prevent the occurrence of resonance oscillations in the MUTE mode of audio amplifiers which may result, at least in part, from parasitic capacitances. According to a specific embodiments, these goals are achieved by generating a compensating current which effectively cancels the effects of the parasitic current generated in the parasitic capacitance of the driver circuit's input device. This compensating current is generated using a compensating device configured similarly to the driver circuit's input device. The compensating current is generated in the compensating device's parasitic capacitance due to the same condition which causes the parasitic current in the input device. A current mirror is then used to provide the same magnitude current to the parasitic capacitance of the driver circuit's input device, thereby canceling at least part of the effect of the parasitic current.

Thus, the present invention provides a circuit for compensating for a first parasitic current corresponding to a first parasitic capacitance associated with a first switch. A second switch is configured substantially the same as the first switch, the second switch having a second parasitic capacitance associated therewith. A current mirror coupled to the second switch generates a compensating current in response to a second parasitic current corresponding to the second parasitic capacitance. The compensating current compensates for at least a portion of the first parasitic current.

A further understanding of the nature and advantages of the present invention may be realized by reference to the remaining portions of the specification and the drawings.

DETAILED DESCRIPTION OF SPECIFIC EMBODIMENTS

Figure 1:
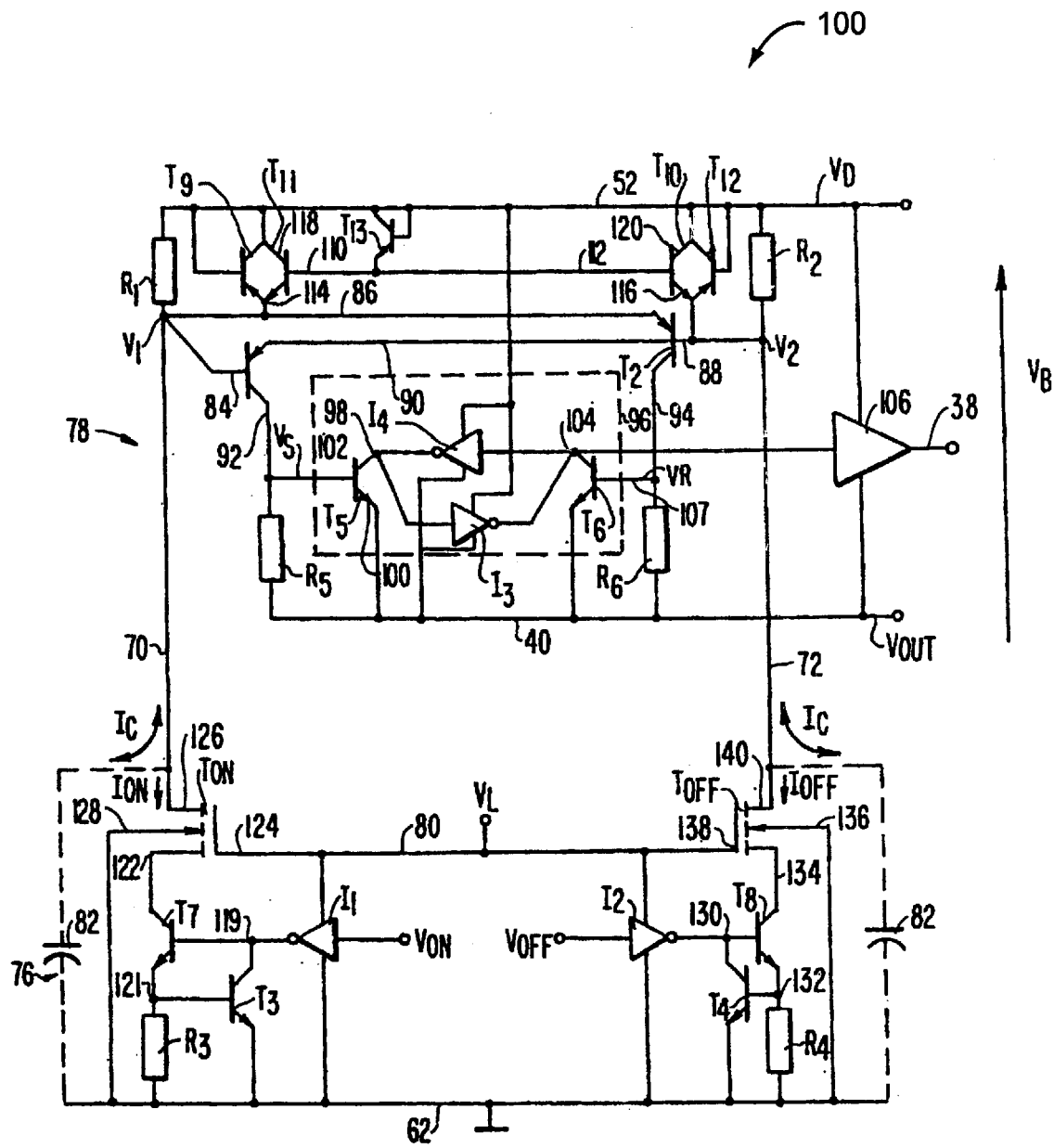
FIG. 1 is a schematic diagram of a half-bridge driver circuit.
Figure 2:
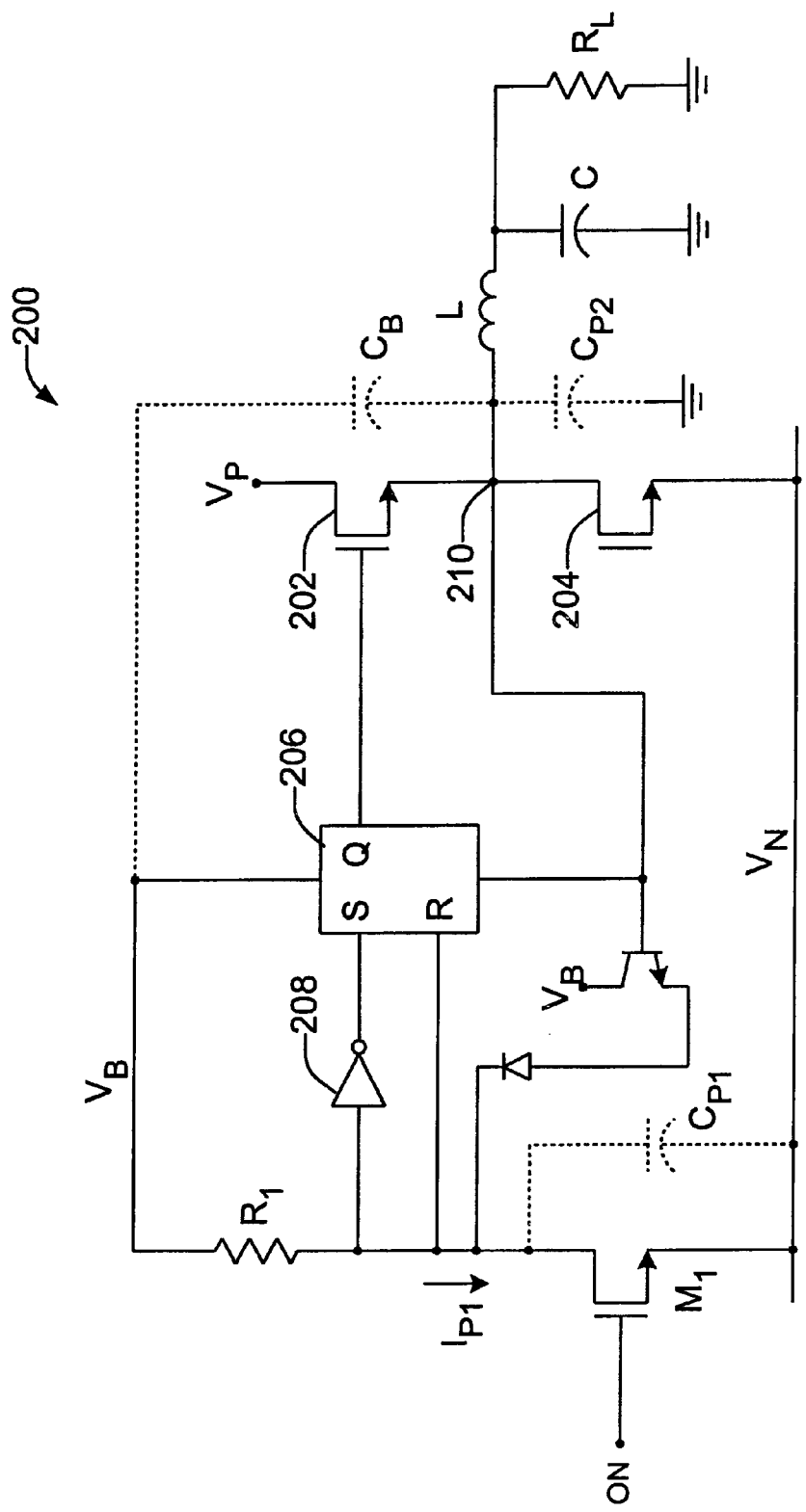
FIG. 2 is a schematic diagram of a half-bridge driver circuit for illustrating a specific embodiment of the present invention.

FIG. 2 shows one solution for the problem described above with reference to FIG. 1 according to which an "on" pulse will not be ignored. That is, with circuit 200, high side device 202 is always turned on if an "on" signal is present.

This is because when an "on" signal is present, the drain of device $M_1$ is pulled low and latch 206 is set via inverter 208 thereby providing drive to device 202. By contrast, when the "on" signal is not present, latch 206 is typically reset and the drive to device 202 is removed. It should be noted that because circuit 200 responds to levels rather than pulses, the "on" signal should not go through a pulse generator as with circuit 100 of FIG. 1.

The improvement over the circuit of FIG. 1 is largely due to the fact that the driver circuitry of FIG. 2 is single-ended rather than differential and that therefore simultaneous "on" and "off" signals do not create the condition under which true "on" signals are ignored. In addition and despite the fact that specific devices in FIG. 2 are shown to be field effect transistors (FETs) or that latch 206 is shown as an RS flip-flop, it will be understood that a variety of different device types may be employed such as, for example, bipolar devices in place of the FETs or any type of latch (e.g., JK flip-flop) in place of latch 206. Alternatively, flip-flop 206 could be replaced with another inverter stage.

As described above with reference to FIG. 1, high side device 202 of FIG. 2 may still be turned on as a result of the charging of parasitic capacitance in the circuit. In FIG. 1 this was represented as currents $I_C$ charging parasitic capacitances 82. In FIG. 2 it is represented as the current $I_{p1}$ charging parasitic capacitance $C_{p1}$. Also as described above, this condition occurs when the low side device (e.g., device 204 in FIG. 2) is switched off and the inductive load (e.g., inductor L of FIG. 2) forces current into the circuit output node (e.g., node 210 of FIG. 2). Under this condition in circuit 200, voltage is developed across resistor $R_1$ resulting in current $I_{p1}$ charging parasitic capacitance $C_{p1}$.

The turning on of high side device 202 as a result of the charging of parasitic capacitance $C_{p1}$ rather than an actual "on" signal is generally not a problem in switching applications (e.g., a switch mode audio amplifier) in that the shutting off of the low side device typically and immediately precedes the turning on of the high side device. That is, the high side device was to be turned on in any event.

However, there are certain conditions, e.g., MUTE modes in audio amplifiers, where this parasitic "on" signal is undesirable. That is, in a MUTE condition, both high and low side devices should be off. If such a MUTE condition is initiated while the low side device is on, when the low side device is then turned off, the same parasitic "on" condition for the high side device described above may occur, turning the high side device on when it should be off. Moreover, if the high side device should be turned on in this way, an oscillation can be initiated in the absence of a control signal which excites a resonance comprising inductor L, capacitor C and the parasitic capacitance at the output of the power stage, $C_{P2}$. This oscillation turns the high side device on and off at the resonance frequency which, as will be understood, is undesirable in MUTE mode.

Figure 3:
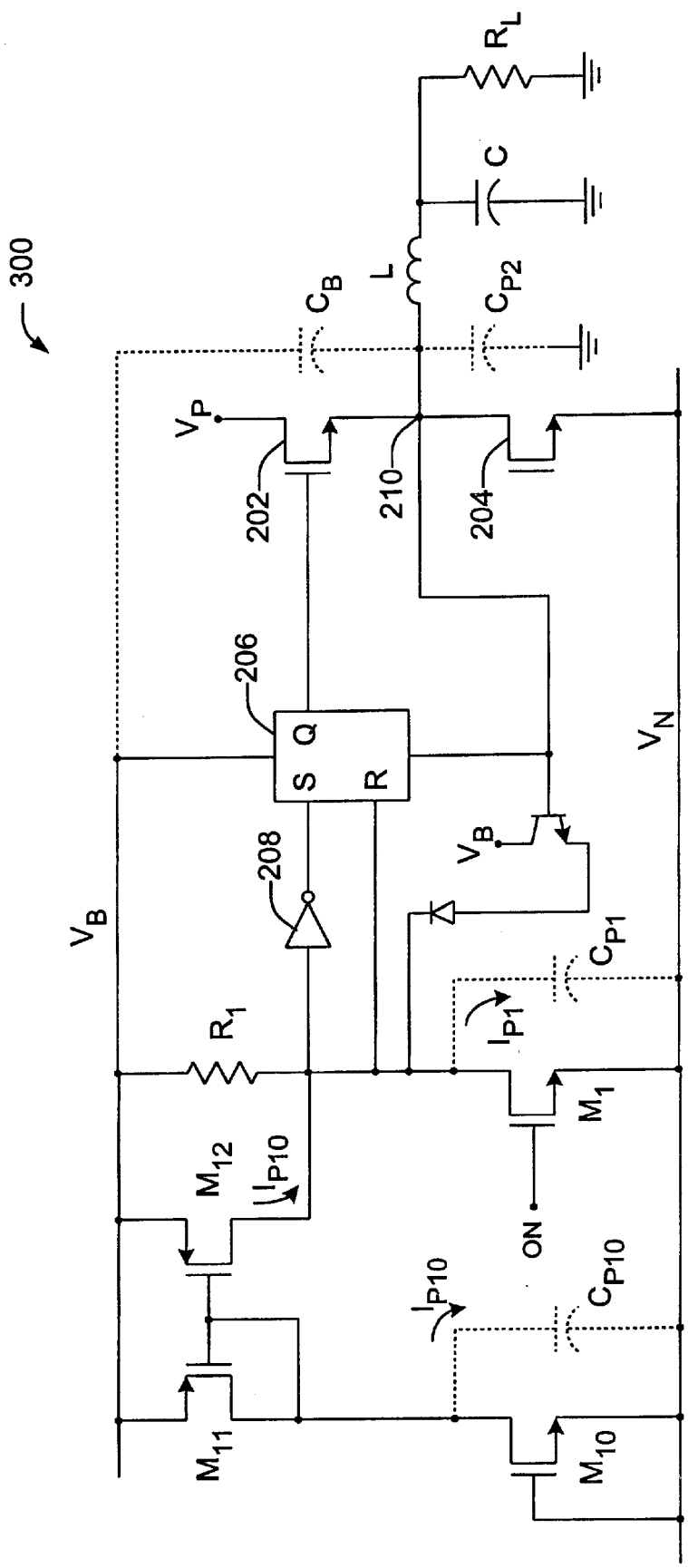
FIG. 3 is a schematic diagram of a half-bridge driver circuit including parasitic current compensation circuitry designed according to the present invention.

Circuit 300 of FIG. 3 incorporates an enhancement to the circuit of FIG. 2 which eliminates the undesirable false "on" condition as well as the resonance oscillation described above. Circuit elements in FIG. 3 having reference numbers corresponding to circuit elements in FIG. 2 operate similarly to those corresponding elements. Circuit 300 includes parasitic current compensation circuitry which provides a compensating current which flows in parasitic capacitance $C_{P1}$ when the output of the high side device 202 transitions toward the positive rail.

This compensating current is generated using an additional transistor $M_{10}$ configured similarly to transistor $M_1$ and an associated current mirror comprising transistors $M_{11}$ and $M_{12}$. $M_{10}$ has a corresponding parasitic capacitance $C_{P10}$. According to a specific embodiment, the geometries of transistors $M_1$ and $M_{10}$ are closely matched such that parasitic capacitances $C_{P1}$ and $C_{P10}$ are also closely matched.

Under the condition when the output of the high side device is being driven toward the positive rail, the current $I_{P1}$ is generated in $C_{P1}$ as described above. Because of the similarities in device geometry, a matching compensating current $I_{P10}$ is also generated in $C_{P10}$ under the same condition. Compensating current $I_{P10}$ also flows in transistor $M_{11}$ which is then mirrored in transistor $M_{12}$, effectively canceling current $I_{P1}$. Without the parasitic current $I_{P1}$ flowing through resistor $R_1$, latch 206 is not set and high side device 202 is not turned on. That is, neither the false "on" condition nor the undesirable resonance oscillation occurs.

It will be understood that the parasitic current compensation circuitry of the present invention may also be employed to compensate for the parasitic currents $I_C$ (due to parasitic capacitors 82) in driver circuit 100 of FIG. 1. In fact, the parasitic current compensation circuitry of the present invention may be used in a wide variety of applications to compensate for or eliminate parasitic currents and their undesirable effects.

While the invention has been particularly shown and described with reference to specific embodiments thereof, it will be understood by those skilled in the art that changes in the form and details of the disclosed embodiments may be made without departing from the spirit or scope of the invention. For example, in the description of the embodiment shown in FIG. 3, transistors $M_1$ and $M_{10}$ are described as being closely matched. It will be understood, that these transistors may be substantially identical. It will also be understood, however, that these transistors may not be identical without departing from the scope of the invention. That is, the technique of the present invention may have efficacy in certain applications even where these transistors are not perfectly matched.

In addition, it will be understood that the schematic diagrams described herein represent a wide variety of circuit topologies and process technologies. For example, devices shown as single transistors could, in fact, represent multiple transistors in a parallel configuration. Moreover, the circuitry described herein may be implemented using a wide variety of semiconductor processing techniques such as, for example, CMOS, pMOS, and nMOS. Therefore, the scope of the invention should be determined with reference to the appended claims.

What is claimed is:

1. A circuit for compensating for a first parasitic current corresponding to a first parasitic capacitance associated with a first switch, comprising:

a second switch configured substantially the same as the first switch, the second switch having a second parasitic capacitance associated therewith; and a current minor coupled to the second switch for generating a compensating current in response to a second parasitic current corresponding to the second parasitic capacitance, the compensating current compensating for at least a portion of the first parasitic current.

2. The circuit of claim 1 wherein the first switch has a first device geometry associated therewith, and wherein a second device geometry associated with the second switch is substantially identical to the first device geometry.

3. The circuit of claim 1 wherein the first switch has a first device geometry associated therewith, and wherein a second device geometry associated with the second switch is not identical to the first device geometry.

4. The circuit of claim 1 wherein the magnitude of the compensating current is substantially the same as the magnitude of the first parasitic current.

5. The circuit of claim 1 wherein the magnitude of the compensating current is different than the magnitude of the first parasitic current.

6. The circuit of claim 1 wherein the first and second switches each comprise multiple devices.

7. The circuit of claim 1 wherein the first and second switches and the current mirror are implemented using CMOS technology.

8. A circuit, comprising:
   a half-bridge circuit comprising a high side device and a low side device; and
   a driver circuit for driving the high side device, the driver circuit comprising,
   an input switch for receiving an input signal, the input switch having a first parasitic capacitance associated therewith, the first parasitic capacitance corresponding to a first parasitic current;
   a latch coupled to the input switch for providing drive to the high side device;
   a compensation switch configured substantially the same as the input switch, the compensation switch having a second parasitic capacitance associated therewith; and
   a current mirror coupled to the compensation switch for generating a compensating current in response to a second parasitic current corresponding to the second parasitic capacitance, the compensating current compensating for at least a portion of the first parasitic current.

* * * * *

UNITED STATES PATENT AND TRADEMARK OFFICE
CERTIFICATE OF CORRECTION

PATENT NO. : 6,362,679 B2  
DATED : March 26, 2002  
INVENTOR(S) : Donald T. Wile It is certified that error appears in the above-identified patent and that said Letters Patent is hereby corrected as shown below:

<u>Column 4,</u>  
Line 57, change "minor" to -- mirror --.

Signed and Sealed this

Eleventh Day of June, 2002

Attest:

Attesting Officer

JAMES E. ROGAN  
*Director of the United States Patent and Trademark Office*